United States Patent
Aoki

(10) Patent No.: US 7,342,177 B2
(45) Date of Patent: Mar. 11, 2008

(54) WIRING BOARD, ELECTRO-OPTICAL DEVICE AND ELECTRONIC INSTRUMENT

(75) Inventor: Koji Aoki, Fujimi-cho (JP)

(73) Assignee: Seiko Epson, Tokyo (JP)

( * ) Notice: Subject to any disclaimer, the term of this patent is extended or adjusted under 35 U.S.C. 154(b) by 379 days.

(21) Appl. No.: 10/760,584

(22) Filed: Jan. 21, 2004

(65) Prior Publication Data

US 2004/0211592 A1   Oct. 28, 2004

(30) Foreign Application Priority Data

Feb. 4, 2003   (JP)   ............................. 2003-027088
Nov. 10, 2003  (JP)   ............................. 2003-379938

(51) Int. Cl.
*H05K 1/00*   (2006.01)

(52) U.S. Cl. ...................... 174/250; 174/251; 174/259

(58) Field of Classification Search ........ 174/250–259; 349/110–118
See application file for complete search history.

(56) References Cited

U.S. PATENT DOCUMENTS

| | | | |
|---|---|---|---|
| 6,031,521 A * | 2/2000 | Luzzatto | 345/157 |
| 6,075,580 A * | 6/2000 | Kouchi | 349/110 |
| 6,172,721 B1 * | 1/2001 | Murade et al. | 349/43 |
| 6,559,485 B2 | 5/2003 | Aoyama | |
| 6,727,871 B1 | 4/2004 | Suzuki et al. | |
| 6,887,631 B2 * | 5/2005 | Kiguchi et al. | 430/7 |

FOREIGN PATENT DOCUMENTS

| | | |
|---|---|---|
| JP | A 05-299786 | 11/1993 |
| JP | A 06-216526 | 8/1994 |
| JP | A 10-189252 | 7/1998 |
| JP | 11-24606 | 1/1999 |
| JP | A 2000-294925 | 10/2000 |
| JP | A 2001-076868 | 3/2001 |
| JP | A 2001-281680 | 10/2001 |
| JP | A 2001-345024 | 12/2001 |
| JP | A 2003-31588 | 1/2003 |
| KR | 2001-039557 | 5/2001 |
| KR | 2001-0050817 | 6/2001 |

OTHER PUBLICATIONS

U.S. Appl. No. 10/764,522, filed Jan. 27, 2004, Aoki.

* cited by examiner

*Primary Examiner*—Tuan T. Dinh
(74) *Attorney, Agent, or Firm*—Oliff & Berridge, PLC

(57) ABSTRACT

A wiring board includes a substrate, an interconnect layer formed of a plurality of layers formed over the substrate, and a plurality of electrodes formed to overlap the interconnect layer. An interconnecting pattern positioned in one of the plurality of layers forming the interconnect layer has at least three interconnecting lines under each of the electrodes, extending parallel to each other at the same intervals.

8 Claims, 12 Drawing Sheets

WIRING BOARD, ELECTRO-OPTICAL DEVICE AND ELECTRONIC INSTRUMENT

Japanese Patent Application No. 2003-27088, filed on Feb. 4, 2003, and Japanese Patent Application No. 2003-379938, filed on Nov. 10, 2003, are hereby incorporated by reference in their entirety.

BACKGROUND OF THE INVENTION

The present invention relates to a wiring board and electro-optical device, to a method of manufacture thereof, and to an electronic instrument.

In an electroluminescence panel, a plurality of electroluminescent elements are arranged two-dimensionally. Each electroluminescent element has an electrode and a light-emitting layer formed thereon (for example, see Japanese Patent Application Laid Open No. 11-24606). To increase the area of the light-emitting region, it is desirable for the pixel electrodes to be formed over the interconnecting lines, but it is difficult to make the film thickness of the light-emitting layer uniform since projections and recesses are formed in the electrodes by forming the interconnecting lines under the pixel electrodes. This is not limited to electroluminescent elements, and applies to any electro-optical device constructed with electrodes formed over interconnecting lines with a functional layer (for example a light-emitting layer) formed over the electrodes.

BRIEF SUMMARY OF THE INVENTION

According to one aspect of the present invention, there is provided a wiring board comprising:
a substrate;
an interconnect layer formed of a plurality of layers, the interconnect layer being formed over the substrate; and
a plurality of electrodes formed to overlap the interconnect layer;
wherein an interconnecting pattern has at least three interconnecting lines disposed parallel to each other at the same intervals under the electrodes, the interconnecting pattern being positioned in one of the plurality of layers forming the interconnect layer.

According to another aspect of the present invention, there is provided a wiring board comprising:
a substrate;
an interconnect layer formed of a plurality of layers, the interconnect layer being formed over the substrate; and
a plurality of electrodes formed to overlap the interconnect layer;
wherein a part of a first interconnecting pattern and a part of a second interconnecting pattern are disposed to extend in directions forming a lattice under each of the electrodes, the first interconnecting pattern being positioned in a first layer among the plurality of layers forming the interconnect layer, the second interconnecting pattern being positioned in a second layer among the plurality of layers forming the interconnect layer.

According to a further aspect of the present invention, there is provided a wiring board comprising:
a substrate;
an interconnect layer formed of a plurality of layers, the interconnect layer being formed over the substrate; and
a plurality of electrodes formed to overlap the interconnect layer;
wherein first and second interconnecting patterns positioned respectively in first and second layers among the plurality of layers forming the interconnect layer have portions extending parallel to each other under each of the electrodes, and the parallel extending portions are formed not to overlap each other.

According to still another aspect of the present invention, there is provided a wiring board comprising:
a substrate;
an interconnect layer formed of a plurality of layers, the interconnect layer being formed over the substrate; and
a plurality of electrodes formed to overlap the interconnect layer;
wherein an interconnecting pattern positioned in one of the plurality of layers forming the interconnect layer has an interconnecting line isolated from electrical connection under each of the electrodes.

According to a still further aspect of the present invention, there is provided an electro-optical device comprising:
any one of the above described wiring boards; and
a functional layer for constituting an electro-optical element, the functional layer being formed in a first region of each of the electrodes;
wherein each of the electrodes and one of the plurality of layers forming the interconnect layer supplying power to the electrode are connected in a second region of the electrode.

According to yet another aspect of the present invention, there is provided an electronic instrument comprising the above described electro-optical device.

According to yet another aspect of the present invention, there is provided a method of manufacturing a wiring board, comprising:
forming an interconnect layer over a substrate, the interconnect layer being formed of a plurality of layers;
forming an organic resin layer to cover the interconnect layer, and having an upper surface of the organic resin layer made flat; and
forming a plurality of electrodes on the organic resin layer to overlap the interconnect layer,
wherein an interconnecting pattern positioned in any one of the plurality of layers forming the interconnect layer is formed under each of the electrodes, to have at least three interconnecting lines extending parallel to each other at the same intervals.

According to yet another aspect of the present invention, there is provided a method of manufacturing a wiring board, comprising:
forming an interconnect layer over a substrate, the interconnect layer being formed of a plurality of layers;
forming an organic resin layer to cover the interconnect layer, and having an upper surface of the organic resin layer made flat; and
forming a plurality of electrodes on the organic resin layer to overlap the interconnect layer,
wherein a part of a first interconnecting pattern and a part of a second interconnecting pattern are disposed to extend in directions forming a lattice under each of the electrodes, the first interconnecting pattern being positioned in a first layer among the plurality of layers forming the interconnect layer, the second interconnecting pattern being positioned in a second layer among the plurality of layers forming the interconnect layer.

According to yet another aspect of the present invention, there is provided a method of manufacturing a wiring board, comprising:
forming an interconnect layer over a substrate, the interconnect layer being formed of a plurality of layers;
forming an organic resin layer to cover the interconnect layer, and having an upper surface of the organic resin layer made flat; and
forming a plurality of electrodes on the organic resin layer to overlap the interconnect layer, wherein first and second interconnecting patterns positioned respectively in first and second layers among the plurality of layers forming the interconnect layer are formed to have portions extending parallel to each other under each of the electrodes, and the parallel extending portions are formed not to overlap.

According to yet another aspect of the present invention, there is provided a method of manufacturing a wiring board, comprising:

forming an interconnect layer over a substrate, the interconnect layer being formed of a plurality of layers;

forming an organic resin layer to cover the interconnect layer, and having an upper surface of the organic resin layer made flat; and forming a plurality of electrodes on the organic resin layer to overlap the interconnect layer, wherein an interconnecting pattern positioned in one of the plurality of layers forming the interconnect layer is formed to have an interconnecting line isolated from electrical connection under each of the electrodes.

According to yet another aspect of the present invention, there is provided a method of manufacturing an electro-optical device, comprising:

manufacturing a wiring board by any one of the above described methods; and forming a functional layer for constituting an electro-optical element in a first region of each of the electrodes, wherein each of the electrodes and one of the plurality of layers forming the interconnect layer supplying power to the electrode are connected in a second region of the electrode.

DETAILED DESCRIPTION OF THE EMBODIMENT

Figure 1:
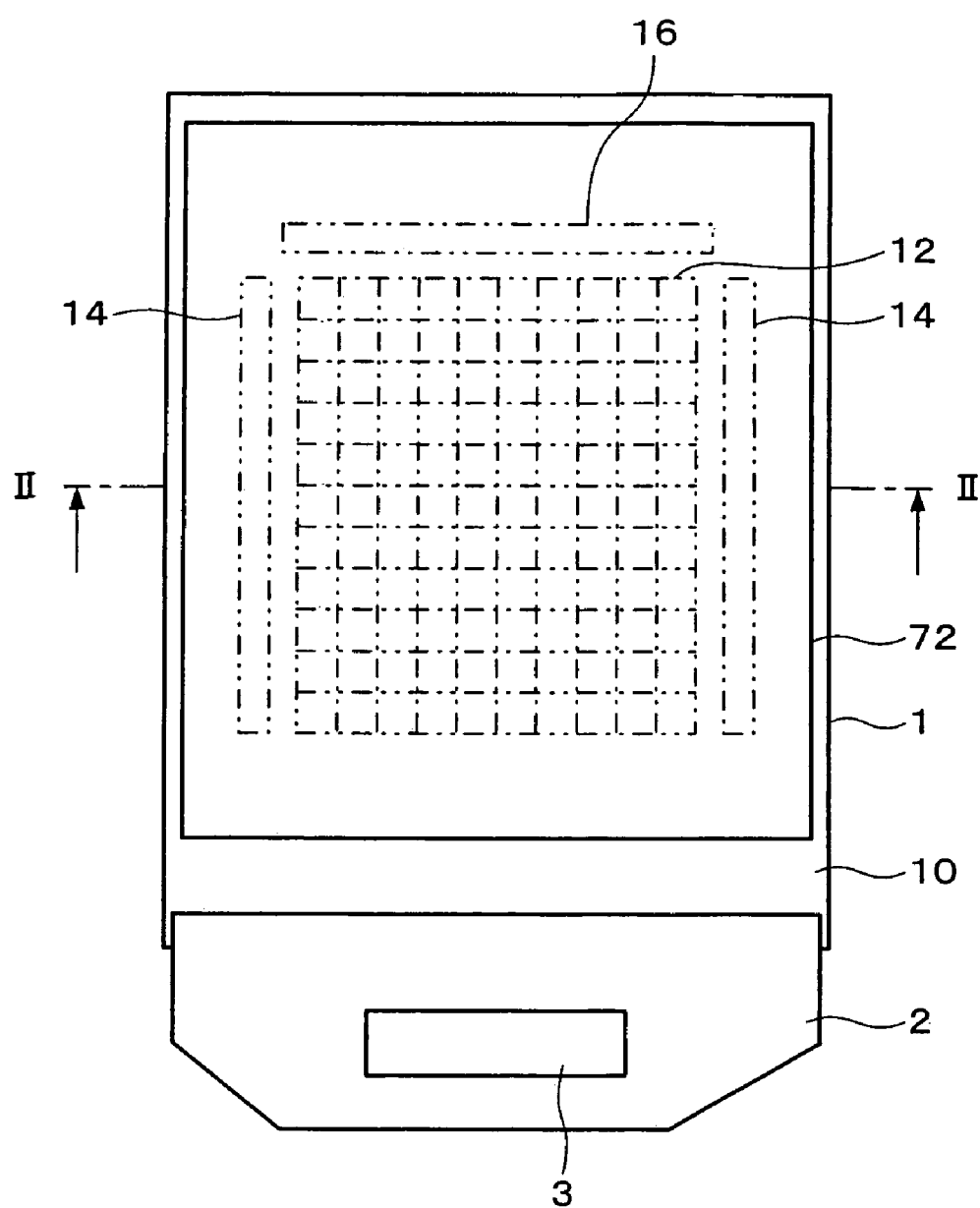
FIG. 1 illustrates an electro-optical device in accordance with a first embodiment of the present invention.

An object of the embodiments of the present invention is to improve the uniformity of film thickness of a functional layer (for example a light-emitting layer) in an operating element.

(1) According to one embodiment of the present invention, there is provided a wiring board comprising:

a substrate;

an interconnect layer formed of a plurality of layers, the interconnect layer being formed over the substrate; and a plurality of electrodes formed to overlap the interconnect layer;

wherein an interconnecting pattern has at least three interconnecting lines disposed parallel to each other at the same intervals under the electrodes, the interconnecting pattern being positioned in one of the plurality of layers forming the interconnect layer. According to the embodiment of the present invention, since at least three interconnecting lines disposed parallel to each other at the same intervals, even if projections and recesses are formed in the electrodes, they are uniform. It should be noted that in the embodiment of the present invention, "the same intervals" means at least the same intervals by design, and includes the case of being disposed at the same intervals taking into account manufacturing tolerances, in other words, substantially the same intervals. In the embodiment of the present invention, "parallel" means at least parallel by design, and includes the case of being parallel taking into account manufacturing tolerances, in other words, substantially parallel.

(2) According to another embodiment of the present invention, there is provided a wiring board comprising:

a substrate;

an interconnect layer formed of a plurality of layers, the interconnect layer being formed over the substrate; and a plurality of electrodes formed to overlap the interconnect layer;

wherein a part of a first interconnecting pattern and a part of a second interconnecting pattern are disposed to extend in directions forming a lattice under each of the electrodes, the first interconnecting pattern being positioned in a first layer among the plurality of layers forming the interconnect layer, the second interconnecting pattern being positioned in a second layer among the plurality of layers forming the interconnect layer. According to the embodiment of the present invention, since portions of the first and second interconnecting patterns are disposed to extend in directions forming a lattice, depressions are less likely to be formed on each of the electrodes within the lattice. It should be noted that in the embodiment of the present invention, "form a lattice" means at least to form the form of a lattice by design, and includes the case of forming a lattice taking into account manufacturing tolerances, or in other words, substantially forming the form of a lattice.

(3) According to a further embodiment of the present invention, there is provided a wiring board comprising:

a substrate;
an interconnect layer formed of a plurality of layers, the interconnect layer being formed over the substrate; and
a plurality of electrodes formed to overlap the interconnect layer;
wherein first and second interconnecting patterns positioned respectively in first and second layers among the plurality of layers forming the interconnect layer have portions extending parallel to each other under each of the electrodes, and the parallel extending portions are formed not to overlap each other. According to the embodiment of the present invention, since portions of the first and second interconnecting patterns extending parallel to each other do not overlap, even if projections and recesses are formed in the electrodes, the vertical differences in these projections and recesses would be small. It should be noted that in the embodiment of the present invention, "parallel" means at least parallel by design, and includes the case of being parallel taking into account manufacturing tolerances, in other words, substantially parallel.

(4) According to still another embodiment of the present invention, there is provided a wiring board comprising:

a substrate;
an interconnect layer formed of a plurality of layers, the interconnect layer being formed over the substrate; and
a plurality of electrodes formed to overlap the interconnect layer;
wherein an interconnecting pattern positioned in one of the plurality of layers forming the interconnect layer has an interconnecting line isolated from electrical connection under each of the electrodes. According to the embodiment of the present invention, since an interconnecting line is formed isolated from electrical connection, projections and recesses of the electrodes can be reduced.

(5) The wiring board may further comprise:

an organic resin layer formed to cover the interconnect layer, and having an upper surface made flat,
wherein the electrodes may be formed over the organic resin layer and may be electrically connected to at least one of plurality of layers forming the interconnect layers by passing through the organic resin layer.

(6) According to a still further embodiment of the present invention, there is provided an electro-optical device comprising:

any one of the above described wiring boards; and
a functional layer for constituting an electro-optical element, the functional layer being formed in a first region of each of the electrodes;
wherein each of the electrodes and one of the plurality of layers forming the interconnect layer supplying power to the electrode are connected in a second region of the electrode. According to the embodiment of the present invention, since each of the electrodes is connected to an interconnecting line for supplying power to the electrode in a second region excluding a first region in which the functional layer is disposed, the projections and recesses of the first region in which the functional layer is disposed is reduced, and the uniformity of film thickness of the functional layer can be improved.

(7) According to yet another embodiment of the present invention, there is provided an electronic instrument comprising the above described electro-optical device.

(8) According to yet another embodiment of the present invention, there is provided a method of manufacturing a wiring board, comprising:

forming an interconnect layer over a substrate, the interconnect layer being formed of a plurality of layers;
forming an organic resin layer to cover the interconnect layer, and having an upper surface of the organic resin layer made flat; and
forming a plurality of electrodes on the organic resin layer to overlap the interconnect layer,
wherein an interconnecting pattern positioned in any one of the plurality of layers forming the interconnect layer is formed under each of the electrodes, to have at least three interconnecting lines extending parallel to each other at the same intervals. According to the embodiment of the present invention, since at least three interconnecting lines are disposed parallel to each other at the same intervals, an organic resin layer with an upper surface made flat can be more easily formed. It should be noted that in the embodiment of the present invention, "the same intervals" means at least the same intervals by design, and includes the case of being disposed at the same intervals taking into account manufacturing tolerances, in other words, substantially the same intervals. In the embodiment of the present invention, "parallel" means at least parallel by design, and includes the case of being parallel taking into account manufacturing tolerances, in other words, substantially parallel.

(9) According to yet anther embodiment of the present invention, there is provided a method of manufacturing a wiring board, comprising:

forming an interconnect layer over a substrate, the interconnect layer being formed of a plurality of layers;
forming an organic resin layer to cover the interconnect layer, and having an upper surface of the organic resin layer made flat; and
forming a plurality of electrodes on the organic resin layer to overlap the interconnect layer,
wherein a part of a first interconnecting pattern and a part of a second interconnecting pattern are disposed to extend in directions forming a lattice under each of the electrodes, the first interconnecting pattern being positioned in a first layer among the plurality of layers forming the interconnect layer, the second interconnecting pattern being positioned in a second layer among the plurality of layers forming the interconnect layer. According to the embodiment of the present invention, since portions of the first and second interconnecting patterns are disposed to extend in directions forming a lattice, an organic resin layer with the upper surface made flat can be more easily formed. It should be noted that in the embodiment of the present invention, "form a lattice" means at least to form the form of a lattice by design, and includes the case of forming a lattice taking into account manufacturing tolerances, or in other words, substantially forming the form of a lattice.

(10) According to yet another embodiment of the present invention, there is provided a method of manufacturing a wiring board, comprising:

forming an interconnect layer over a substrate, the interconnect layer being formed of a plurality of layers;
forming an organic resin layer to cover the interconnect layer, and having an upper surface of the organic resin layer made flat; and
forming a plurality of electrodes on the organic resin layer to overlap the interconnect layer, wherein first and second interconnecting patterns positioned respectively in first and second layers among the plurality of layers forming the interconnect layer are formed to have portions extending parallel to each other under each of the electrodes, and the parallel extending portions are formed not to overlap. According to the embodiment of the present invention, since the parallel extending portions of the first and second interconnecting patterns do not overlap, an organic resin layer with the upper surface made flat can be more easily formed. It should be noted that in the embodiment of the present invention, "parallel" means at least parallel by design, and includes the case of being parallel taking into account manufacturing tolerances, in other words, substantially parallel.

(11) According to yet another embodiment of the present invention, there is provided a method of manufacturing a wiring board, comprising:
  forming an interconnect layer over a substrate, the interconnect layer being formed of a plurality of layers;
  forming an organic resin layer to cover the interconnect layer, and having an upper surface of the organic resin layer made flat; and
  forming a plurality of electrodes on the organic resin layer to overlap the interconnect layer,
  wherein an interconnecting pattern positioned in one of the plurality of layers forming the interconnect layer is formed to have an interconnecting line isolated from electrical connection under each of the electrodes. According to the embodiment of the present invention, since an interconnecting line isolated from electrical connection is formed, an organic resin layer with the upper surface made flat can be more easily formed.

(12) In this method of manufacturing a wiring board,
  the process of forming the organic resin layer may include applying an organic resin precursor.

(13) In this method of manufacturing a wiring board,
  the organic resin precursor may be applied by spin coating.

(14) According to yet another embodiment of the present invention, there is provided a method of manufacturing an electro-optical device, comprising:
  manufacturing a wiring board by any one of the above described methods; and
  forming a functional layer for constituting an electro-optical element in a first region of each of the electrodes,
  wherein each of the electrodes and one of the plurality layers forming the interconnect layer supplying power to the electrode are connected in a second region of the electrode.

The present invention is now described in terms of embodiments, with reference to the drawings.

First Embodiment

Figure 2:
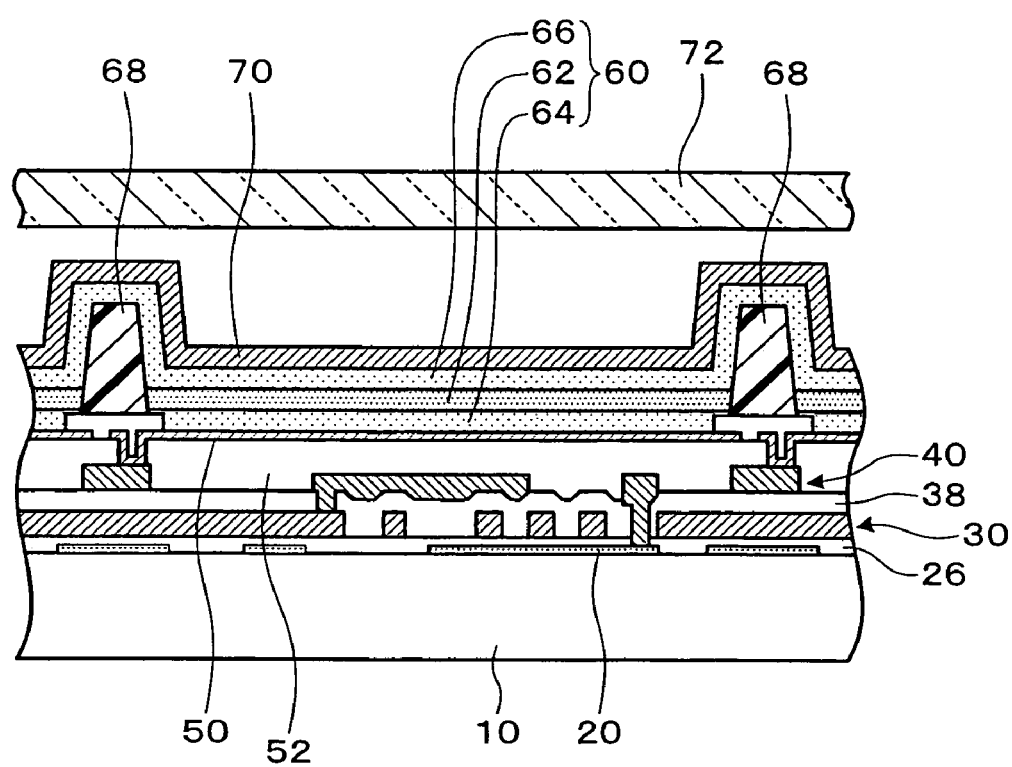
FIG. 2 is a sectional view along the line II-II in FIG. 1.

FIG. 1 illustrates an electro-optical device in accordance with a first embodiment of the present invention. FIG. 2 is a sectional view along the line II-II in FIG. 1. An electro-optical device 1 may be an electro-optical device of a display device (for example a display panel) or the like, or a memory device. The electro-optical device 1 shown in FIG. 1 is an organic EL (electroluminescence) device (for example an organic EL panel). To the electro-optical device 1, a wiring board (for example a flexible substrate) 2 is attached, and electrically connected. For this attachment and electrical connection, an anisotropic conducting material such as an anisotropic conducting film or anisotropic conducting paste or the like may be used. By "electrically connected" is included contact. This is equally true in the following description. On the wiring board 2 are formed an interconnecting pattern and terminals not shown in the drawings. On the wiring board 2 is mounted an integrated circuit chip (or a semiconductor chip) 3. The integrated circuit chip 3 may include a power supply circuit or control circuit or the like. For the mounting, TAB (Tape Automated Bonding) or COF (Chip On Film) may be applied, and the package form may be a TCP (Tape Carrier Package). The electro-optical device 1 having the wiring board 2 on which the integrated circuit chip 3 is mounted may be referred to as an electronic module (for example, a display module such as a liquid crystal module or EL module or the like).

The electro-optical device 1 has a substrate 10. The substrate 10 may be a rigid substrate (for example a glass substrate or silicon substrate), or may be a flexible substrate (for example a film substrate). The substrate 10 may be transparent to light, or may be opaque. For example, in a bottom emission (or back emission) type of display device (for example an organic EL panel), an optically transparent substrate 10 may be used, and light may be emitted from the side of the substrate 10. In a top emission type of organic EL panel, an opaque substrate 10 may be used. It should be noted that the substrate 10 is not limited to being of plate form, and includes the case of other forms, provided that the other elements can be supported.

The substrate 10 includes an operating region (for example a display region) 12. The operating region 12 may have formed a plurality of (for example, m rows and n columns (for example a matrix) of) pixel. In a color display device, one color display pixel may comprise a plurality of sub-pixels (red, green, and blue).

On the substrate 10, one or a plurality of drive circuits (for example a scan line drive circuit) 14 may be provided. The drive circuit 14 drives the operation (for example display operation) of the operating region 12. A pair of drive circuits 14 may be disposed adjacent to both sides of the operating region 12. On the substrate 10, an auxiliary circuit 16 may be provided. The auxiliary circuit 16 may be a checking circuit for checking whether the operation (for example display operation) of the operating region 12 is correct, or may be a precharge circuit for increasing the operating speed (display speed) of the operating region 12. At least one of the drive circuit 14 and auxiliary circuit 16 may be formed using a polysilicon film or the like on the substrate 10, or may be an integrated circuit chip mounted on the substrate 10. It should be noted that the integrated circuit chip 3 on the outside of the substrate 10 may be adapted to control the operating drive of the operating region 12.

Figure 3:
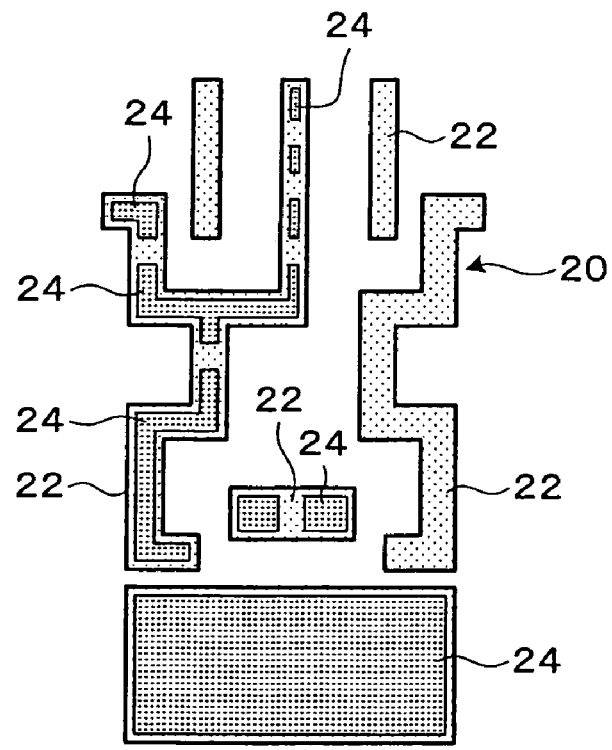
FIG. 3 shows a semiconductor film within each pixel.

On the substrate 10, a semiconductor film 20 may be formed. FIG. 3 shows a semiconductor film within each pixel (for example sub-pixels). The semiconductor film 20 may be formed of a semiconductor material (for example silicon). The semiconductor film 20 may be monocrystalline, polycrystalline, or amorphous. The semiconductor film 20 may be formed by a well-known low temperature (for example 600° C. or below) process, being a so-called low temperature polysilicon film. The semiconductor film 20 has a base film 22. N-type or p-type impurities may be diffused in the base film 22. The semiconductor film 20 has an impurity diffusion film 24. The impurity diffusion film 24 may include a higher concentration of impurities than the base film 22. The impurity diffusion film 24 is formed within a region of the base film 22. The impurity diffusion film 24 may be formed by injecting impurities into a precursor film including a portion to form the base film 22 and a portion to form the impurity diffusion film 24. At least a part of the impurity diffusion film 24 may be a MOS FET source or drain, or may form an electrode of an electronic component such as, a capacitor or the like.

Figure 4:
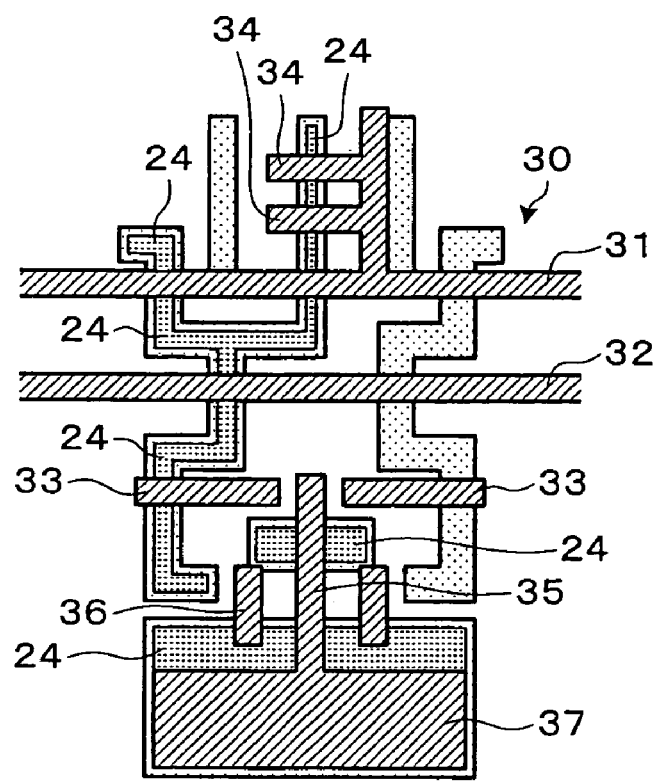
FIG. 4 illustrates an interconnecting pattern positioned in one layer of a plurality of layers forming an interconnect layer.

On the substrate 10 is formed an interconnect layer formed of a plurality of layers. FIG. 4 illustrates an interconnecting pattern positioned in one layer of a plurality of layers forming an interconnect layer. An interconnecting pattern 30 may be formed on the semiconductor film 20 with an insulating layer (for example, a oxide film such as $SiO_2$ or the like) 26 (see, FIG. 2) interposed. The interconnecting pattern 30 includes at least three interconnecting lines 31, 32, and 33 extending parallel to each other at the same intervals. It should be noted that "at the same intervals" means at least at the same intervals by design, and includes the case of being disposed at the same intervals taking into account manufacturing tolerances, in other words, substantially the same intervals (the same applies to subsequent description). "Parallel" means at least parallel by design, and includes the case of being parallel taking into account manufacturing tolerances, in other words, substantially parallel (the same applies to subsequent description). The interconnecting lines 31 and 32 each form in part a MOS FET gate electrode. According to this embodiment, since at least the three interconnecting lines 31, 32, and 33 extend parallel to each other at the same intervals, even if projections and recesses are formed in the electrode 50 (see FIG. 2) over them, since the projections and recesses are uniform, the uniformity of film thickness of the functional layer can be increased.

The interconnecting pattern 30 has a plurality of interconnecting lines 34 electrically connected to the interconnecting line 31, and a part of each interconnecting line 34 forms a MOS FET gate electrode. The interconnecting lines 34 are gate electrodes of a MOS FET having a plurality of gate electrodes, that is to say, a multi-gate transistor, and the plurality of gate electrodes being gate electrodes of each multi-gate transistor may be formed to be disposed at the same intervals. The interconnecting lines 34 extend parallel to the interconnecting lines 31 and 32. Furthermore, the interconnecting pattern 30 includes an interconnecting line 35 extending in a direction to intersect (for example orthogonal to) the interconnecting lines 31, 32, and 34. A part of the interconnecting line 35 also forms a MOS FET gate electrode. The interconnecting lines 31, 32, 34, and 35 are disposed between a pair of impurity diffusion films 24, to pass over a part of the base film 22. For example, with the interconnecting lines 31, 32, 34, and 35 as a mask, impurities may be injected into the precursor film, to form the impurity diffusion films 24.

The interconnecting lines 33 are interconnecting lines isolated from electrical connection (dummy interconnecting lines). The interconnecting pattern 30 includes interconnecting lines 36 that extend in a direction to intersect (for example orthogonal to) the interconnecting lines 33. The interconnecting lines 36 also are interconnecting lines isolated from electrical connection (dummy interconnecting lines). According to this embodiment, since the interconnecting lines 33 and 36 isolated from electrical connection are formed, the projections and recesses of the electrode 50 (see FIG. 2) formed over them can be reduced, and the uniformity of film thickness of the functional layer can be increased.

The interconnecting pattern 30 includes an electrode 37 opposing the impurity diffusion films 24. The impurity diffusion films 24 and the electrode 37 may, by virtue of the insulating layer 26 between them, constitute a capacitor 88 (see FIG. 7). The electrode 37 is electrically connected to the interconnecting line 35.

Figure 5:
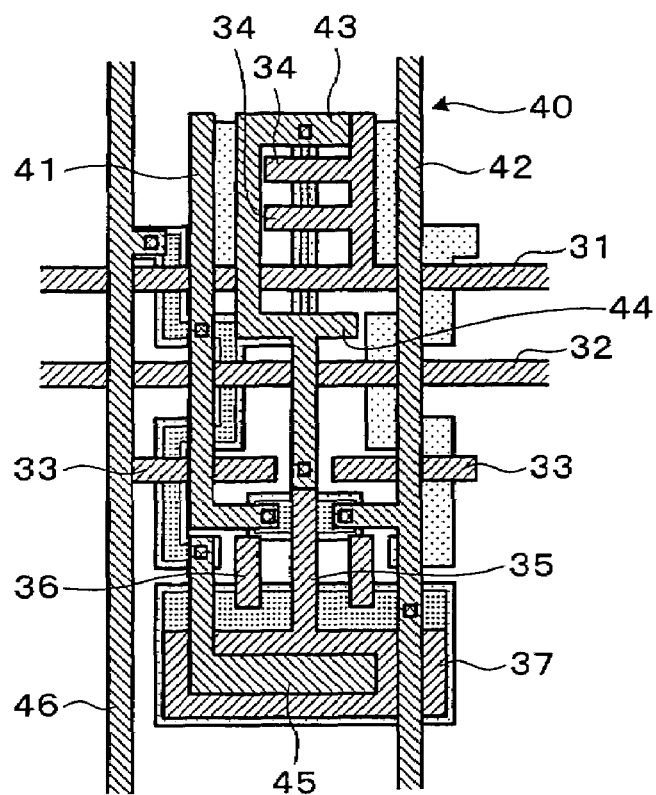
FIG. 5 illustrates an interconnecting pattern positioned in another layer of a plurality of layers forming the interconnect layer.

FIG. 5 illustrates an interconnecting pattern positioned in another layer of a plurality of layers forming the interconnect layer. Over the above described interconnecting pattern 30, an interconnecting pattern 40 may be formed with an insulating layer 38 (see FIG. 2) interposed. The interconnecting pattern 40 includes in part interconnecting lines 41 and 42. The interconnecting lines 41 and 42 extend in a direction to intersect (for example orthogonal to) the interconnecting lines 31 and 32 of the interconnecting pattern 30. The interconnecting lines 31 and 32 of the interconnecting pattern (first interconnecting pattern) 30, and the interconnecting lines 41 and 42 of the interconnecting pattern (second interconnecting pattern) 40 may be disposed to extend in directions forming a lattice. At least a part of the interconnecting lines 31 and 32 and at least a part of the interconnecting lines 41 and 42 may form a lattice. It should be noted that "form a lattice" means at least by design to form the form of a lattice, and includes the case of forming a lattice taking into account manufacturing tolerances, or in other words, substantially forming the form of a lattice (the same applies to subsequent description). According to this embodiment, since portions of the first and second interconnecting patterns 30 and 40 extend in directions to form a lattice, within the lattice, the formation of depressions in the electrode 50 (see FIG. 2) formed over them is less likely, and the uniformity of film thickness of the functional layer can be increased. The interconnecting pattern 40 has an interconnecting line 46 disposed on the outside of the electrode 50 (see FIG. 6).

The interconnecting pattern 40 includes as part thereof interconnecting lines 43, 44, and 45. The interconnecting lines 31, 32, 33, and 34 of the interconnecting pattern (first interconnecting pattern) 30, and the interconnecting lines 43, 44, and 45 of the interconnecting pattern (second interconnecting pattern) 40 extend to be mutually parallel. The interconnecting lines 31, 32, 33, and 34, and the interconnecting lines 43, 44, and 45 are formed so as not to overlap. According to this embodiment, since portions of the first and second interconnecting patterns 30 and 40 extending parallel do not overlap, even if there are projections and recesses formed in the electrode 50 (see FIG. 2) formed over them, the vertical differences in these projections and recesses are reduced, and the uniformity of film thickness of the functional layer can be increased.

An organic resin layer 52 is formed to cover the interconnect layer (for example the interconnecting pattern 40) formed of a plurality of layers. The organic resin layer 52 has the upper surface made flat.

Figure 6:
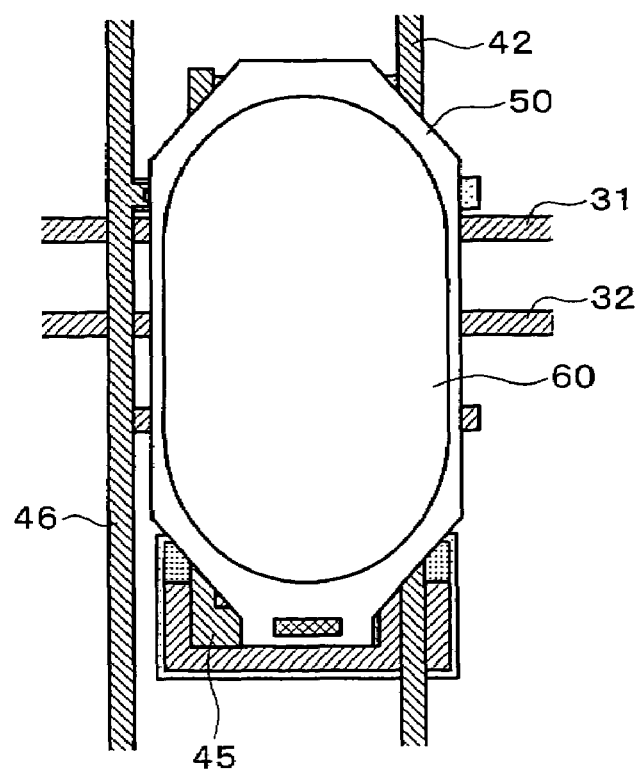
FIG. 6 illustrates an electrode over the interconnect layer.

The electro-optical device 1 has a plurality of electrodes. FIG. 6 illustrates one of these electrodes. The electrode (for example first electrode) 50 is formed to overlap the above described interconnect layer (For example this includes interconnecting patterns 30 and 40.). The electrode 50 is formed over the organic resin layer 52. The electrode 50 may be electrically connected to the interconnecting pattern 40 (for example the interconnecting line 45 thereof) of the uppermost layer of the interconnect layers. This electrical connection may be achieved passing through the organic resin layer 52.

For example, excluding a first region (the region in which the functional layer (light-emitting layer 62 or the like) for constituting the electro-optical element is formed) of the electrode 50, in a second region (for example a contact region), the electrode 50 and the interconnecting line 45 supplying power to the electrode 50 are electrically connected. By this means, the projections and recesses of the first region (for example light-emitting region) in which the functional layer (light-emitting layer 62 or the like) is disposed can be reduced, and the uniformity of film thickness of the functional layer (light-emitting layer 62 or the like) can be increased. The second region may be formed over a capacitor section. The second region may be formed within a bank 68, and by means of this corrosion of the second region is prevented, and parasitic capacitance with the cathode (second electrode 70) can be reduced. The aperture ratio by the second region (contact region) can be increased. The content of this paragraph can also be applied to other embodiments.

Below the electrode 50, the interconnecting lines 31, 32, 33, and 34 extend parallel to each other at the same intervals. Below the electrode 50, the interconnecting lines (dummy interconnecting lines) 33 and 36 are formed. Below the electrode 50, at least a part of the interconnecting lines 31 and 32, and at least a part of the interconnecting lines 41 and 42 form a lattice. Below the electrode 50, the interconnecting lines 31, 32, 33, and 34, and the interconnecting lines 43, 44, and 45 are formed so as not to overlap.

On the substrate 10, a plurality of operating elements 60 are provided. The region in which the plurality of operating elements 60 are provided is the operating region 12. One operating element 60 is provided for one pixel (for example sub-pixel). As shown in FIG. 2, the plurality of operating elements 60 includes a plurality of light-emitting layers 62 for a plurality of emitted light colors (for example red, green, and blue). Each operating element 60 has a light-emitting layer 62 for one of the emitted light colors. The material constituting the light-emitting layer 62 may be a polymer material or a material of low molecular weight or a material using combination of the two. The light-emitting layer 62 emits light when an electric current flows. The light-emitting layer 62 may have different light emitting efficiencies for different emitted light colors.

The operating elements 60 may have either or both first and second buffer layers 64 and 66. The first buffer layer 64 may be a positive hole injection layer for stabilizing the injection of positive holes into the light-emitting layer 62, or may have a positive hole injection layer. The first buffer layer 64 may have a positive hole transport layer. The positive hole transport layer may be provided between the light-emitting layer 62 and the positive hole injection layer. The second buffer layer 66 may be an electron injection layer stabilizing the injection of electrons into the light-emitting layer 62, or may have an electron injection layer. The second buffer layer 66 may have an electron transport layer. The electron transport layer may be provided between the light-emitting layer 62 and the electron injection layer. Adjacent operating elements 60 are delineated (electrically insulated) by the bank 68.

The above described electrode (first electrode) 50 supplies electrical energy to any of the operating elements 60. The electrode 50 may contact the operating elements 60 (for example the first buffer layer 64 (for example a positive hole injection layer)).

The electro-optical device 1 is provided with a plurality of second electrodes 70 or a second electrode 70. The second electrode 70 supplies electrical energy to the operating elements 60. The second electrode 70 may contact the operating elements 60 (for example the second buffer layer 66 (for example an electron injection layer)). The second electrode 70 has a part opposing the electrode 50. The second electrode 70 may be disposed over the electrode 50.

The electro-optical device 1 has a sealing member 72 for the operating elements 60. If at least a part of the operating elements 60 is subject to deterioration from moisture, oxygen, or the like, the operating elements 60 can be protected by the sealing member 72.

Next, the method of manufacture of the electronic-optical device 1 is described. In this embodiment, on a substrate-10 an interconnect layer (for example, connecting the line patterns 30 and 40) formed of a plurality of layers is formed. Then an organic resin layer 52 is formed, to cover the interconnect layer (for example, the uppermost layer of the interconnecting pattern 40), while making the upper surface flat. The process of forming the organic resin layer 52 may include applying (for example spin coating) an organic resin precursor. By means of this, the organic resin precursor can be provided so that its upper surface is flat, and when this is dried and cured, a uniform temperature can be applied. This contributes to the making flat of the upper surface of the organic resin layer 52.

In this embodiment, the interconnecting pattern 30 positioned as one layer of the interconnect layers is formed so as to have at least the three interconnecting lines 31, 32, and 33 extending parallel to each other at the same intervals in regions under each of a plurality of electrodes. Alternatively, a part of the first interconnecting pattern 30 (for example interconnecting lines 31 and 32) positioned in a first layer of the interconnect layers, and a part of the second interconnecting pattern 40 (for example interconnecting lines 41 and 42) positioned in a second layer of the interconnect layers are formed to extend in directions forming a lattice in regions under each of a plurality of electrodes. Alternatively, the first and second interconnecting patterns 30 and 40 respectively positioned in the first and second layers of the interconnect layers are formed to have portions (the interconnecting lines 31 to 34 and 43 to 45) extending to be mutually parallel in regions under each of a plurality of electrodes, with the portions extending in parallel formed so as not to overlap. Alternatively, the interconnecting pattern 30 positioned in any one layer of the interconnect layers is formed to have interconnecting lines 33 in regions under each of a plurality of electrodes, isolated from electrical connection. By these means, since the organic resin precursor can be spread uniformly over the pixel region (operating region, display region), the upper surface of the organic resin layer 52 can be made flat. This degree of flatness is markedly superior to that obtained when the interconnecting lines are disposed in the conventional island pattern.

Then a plurality of electrodes 50 is formed over the organic resin layer 52, so as to overlap the interconnect layer (for example, interconnecting patterns 30 and 40). Since the organic resin layer 52 is made flat, the electrodes 50 can be formed so that their upper surfaces are flat.

The method of manufacture of the electronic-optical device 1, in addition to the above described method of manufacture of a wiring board, may also include forming a functional layer (light-emitting layer 62 or the like) to constitute electro-optical elements in the first regions (regions in which the functional layer (light-emitting layer 62 or the like) to constitute the electro-optical elements is formed) of each of the plurality of electrodes 50. It should be noted that for each of the plurality of electrodes 50, an interconnect layer (for example the interconnecting pattern 40) supplying power to the electrode 50 is connected to a second region (for example a contact region) of the electrode 50. In respect of other details of the method of manufacture of the electronic-optical device 1, the content that can be induced from the above described construction may be included.

Figure 7:
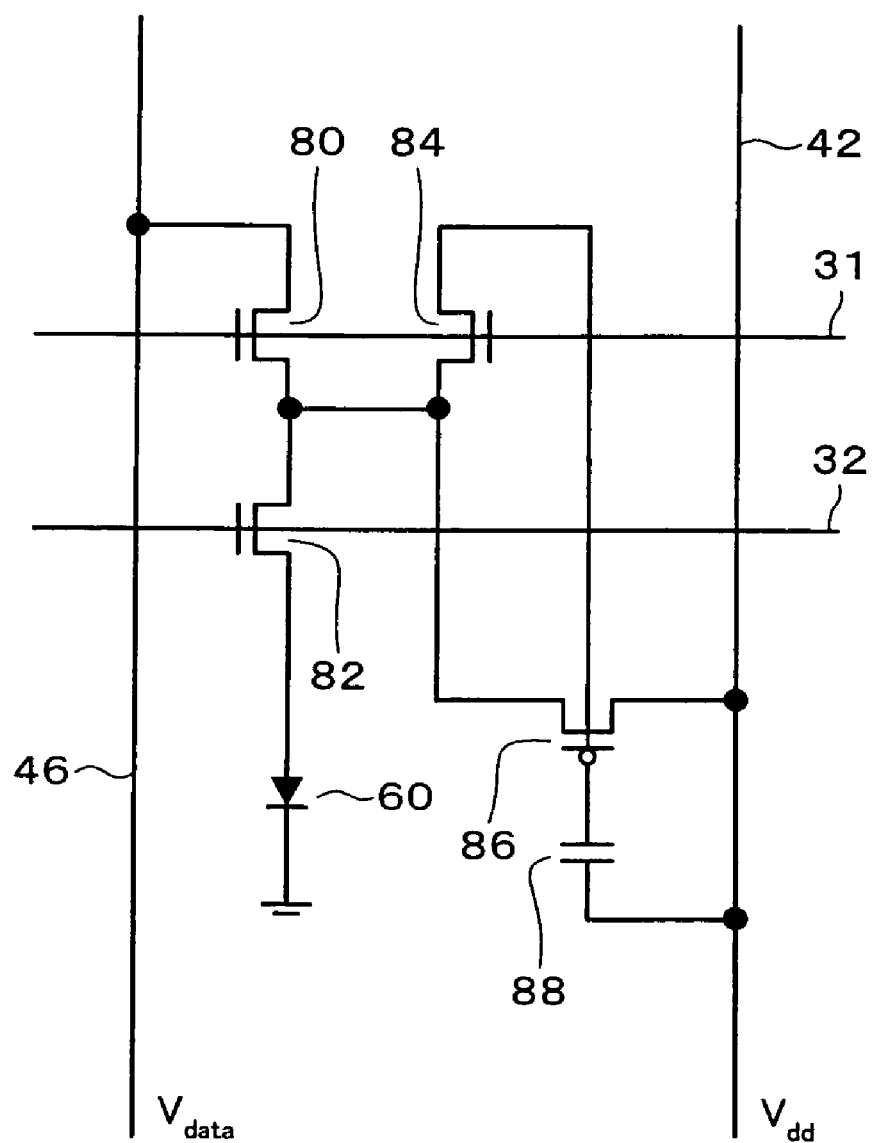
FIG. 7 is a circuit diagram illustrating the operation of the electro-optical device in accordance with the first embodiment of the present invention.

FIG. 7 is a circuit diagram illustrating the operation of the electro-optical device of this embodiment. The electro-optical device 1 has elements corresponding to the circuit shown in FIG. 7. The elements are provided for each operating element 60. The circuit construction (connection pattern of elements) is as shown in FIG. 7, and description thereof is omitted. In this embodiment a power supply voltage $V_{dd}$ is supplied to the interconnecting line 42. A signal voltage $V_{data}$ is supplied to the interconnecting line 46. The signal voltage $V_{data}$ is a signal corresponding to the electric current supplied to the operating element 60. The interconnecting lines (scan lines) 31 and 32 have mutually opposite selection signals input. The selection signals are high level ("H") signal or low level "L" signals.

In a programming interval, a high level signal is input to the interconnecting line 31, and a low level signal is input to the interconnecting line 32. Then a switching element 80 turns on, and according to the potential difference between the interconnecting lines 42 and 46, an electric current flows through the switching elements 80 and 86. The control voltage of the switching element 86 (gate voltage if the switching element 86 is a MOS transistor) depending on this electric current charges the capacitor 88.

In an operating interval (for example a light emitting interval), a low level signal is input to the interconnecting line 31, and a high level signal is input to the interconnecting line 32. Then the switching elements 80 and 84 turn off, the switching element 82 turns on. As a result, the switching element 86 is controlled (for example turned on) by the control voltage (gate voltage if the switching element 86 is a MOS transistor) depending on the charge stored in the capacitor 88 during the programming interval, and an electric current depending on the control voltage flows from the interconnecting line 42 through switching elements 86 and 82, to the operating element 60.

Second Embodiment

FIGS. 8 to 11 illustrate a second embodiment of the electro-optical device of the present invention. In this embodiment, the semiconductor film and interconnect layers differ from the first embodiment. Except for the content of the following description, the description of the first embodiment may also be applied to this embodiment.

Figure 8:
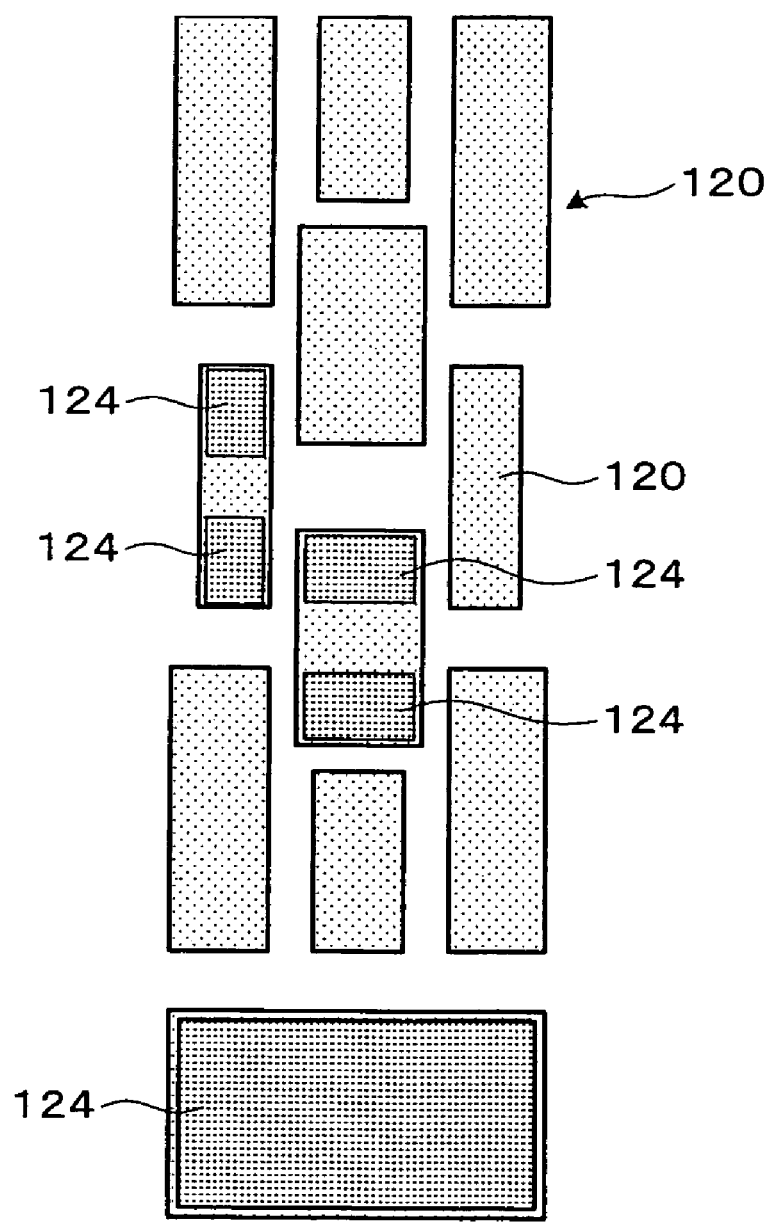
FIG. 8 shows a semiconductor film within each pixel in an electro-optical device in accordance with a second embodiment of the present invention.

In this embodiment a semiconductor film 120 is formed on the substrate 10 described in the first embodiment. FIG. 8 shows the semiconductor film within each pixel (for example sub-pixel). The semiconductor film 120 may be formed of a semiconductor material (for example silicon). The semiconductor film 120 may be any of monocrystalline, polycrystalline, or amorphous. The semiconductor film 120 may be formed by a well-known low temperature (for example 600° C. or below) process, being a so-called low temperature polysilicon film. The semiconductor film 120 has a base film 122. N-type or p-type impurities may be diffused in the base film 122. The semiconductor film 120 has an impurity diffusion film 124. The impurity diffusion film 124 may include a higher concentration of impurities than the base film 122. The impurity diffusion film 124 is formed within a region of the base film 122. The impurity diffusion film 124 may be formed by injecting impurities into a precursor film including a portion to form the base film 122 and a portion to form the impurity diffusion film 124. At least a part of the impurity diffusion film 124 may be a MOS FET source or drain, or may form an electrode of an electronic component such as a capacitor or the like.

Figure 9:
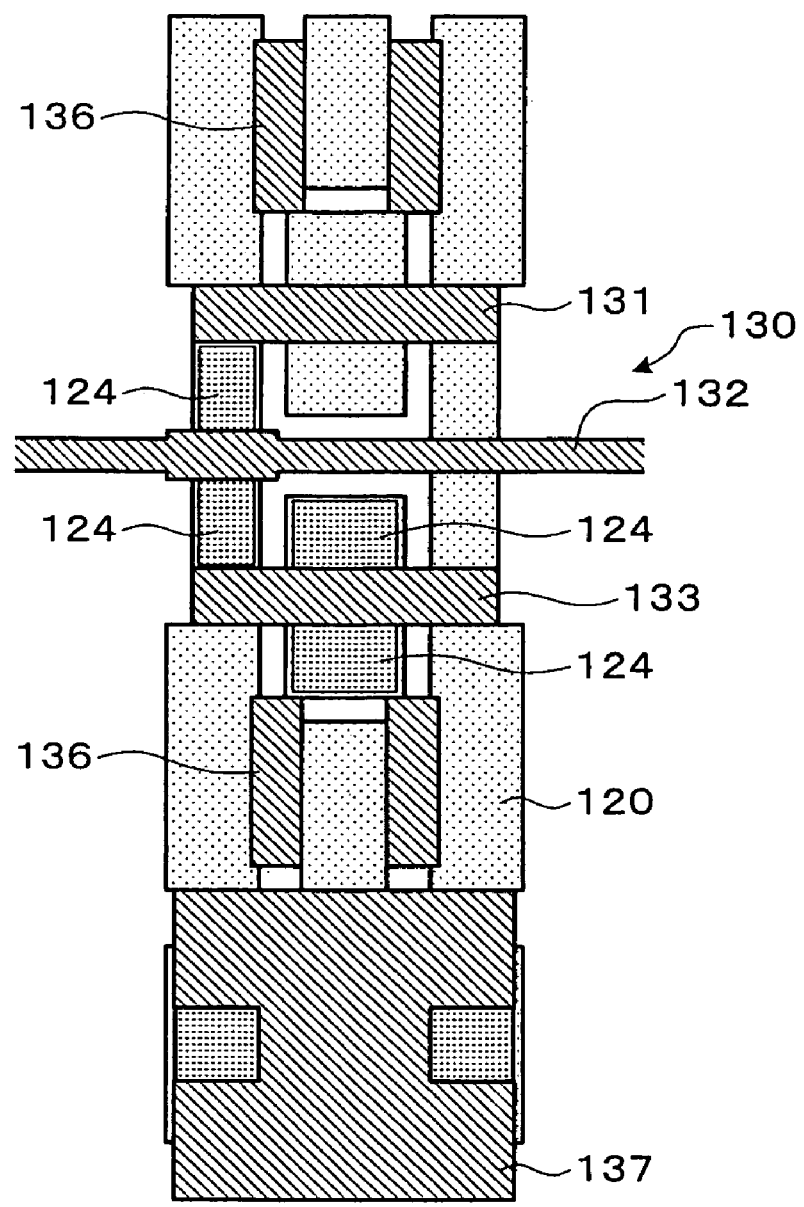
FIG. 9 illustrates an interconnecting pattern positioned in one layer of a plurality of layers forming an interconnect layer.

On the substrate 10 is formed an interconnect layer formed of a plurality of layers. FIG. 9 illustrates an interconnecting pattern positioned in one layer of a plurality of layers forming an interconnect layer. An interconnecting pattern 130 may be formed on the semiconductor film 120 with an insulating layer (for example, a oxide film such as $SiO_2$ or the like) interposed. The interconnecting pattern 130 includes at least three interconnecting lines 131, 132, and 133 extending parallel to each other at the same intervals. The interconnecting lines 132 and 133 each form in part a MOS FET gate electrode. According to this embodiment, since at least the three interconnecting lines 131, 132, and 133 extend parallel to each other at the same intervals, even if projections and recesses are formed in the electrode 150 (see FIG. 11) over them, since the projections and recesses are uniform, the uniformity of film thickness of the functional layer can be increased.

The interconnecting lines 131 are interconnecting lines isolated from electrical connection (dummy interconnecting lines). The interconnecting pattern 130 includes interconnecting lines 136 that extend in a direction to intersect (for example orthogonal to) the interconnecting lines 131. The interconnecting lines 136 also are interconnecting lines isolated from electrical connection (dummy interconnecting lines). According to this embodiment, since the interconnecting lines 131 and 136 isolated from electrical connection are formed, the projections and recesses of the electrode 150 (see FIG. 11) formed over them can be reduced, and the uniformity of film thickness of the functional layer can be increased.

The interconnecting pattern 130 includes an electrode 137 opposing the impurity diffusion films 124. The impurity diffusion films 124 and the electrode 137 may, by virtue of the insulating layer between them, constitute a capacitor 188 (see FIG. 12).

Figure 10:
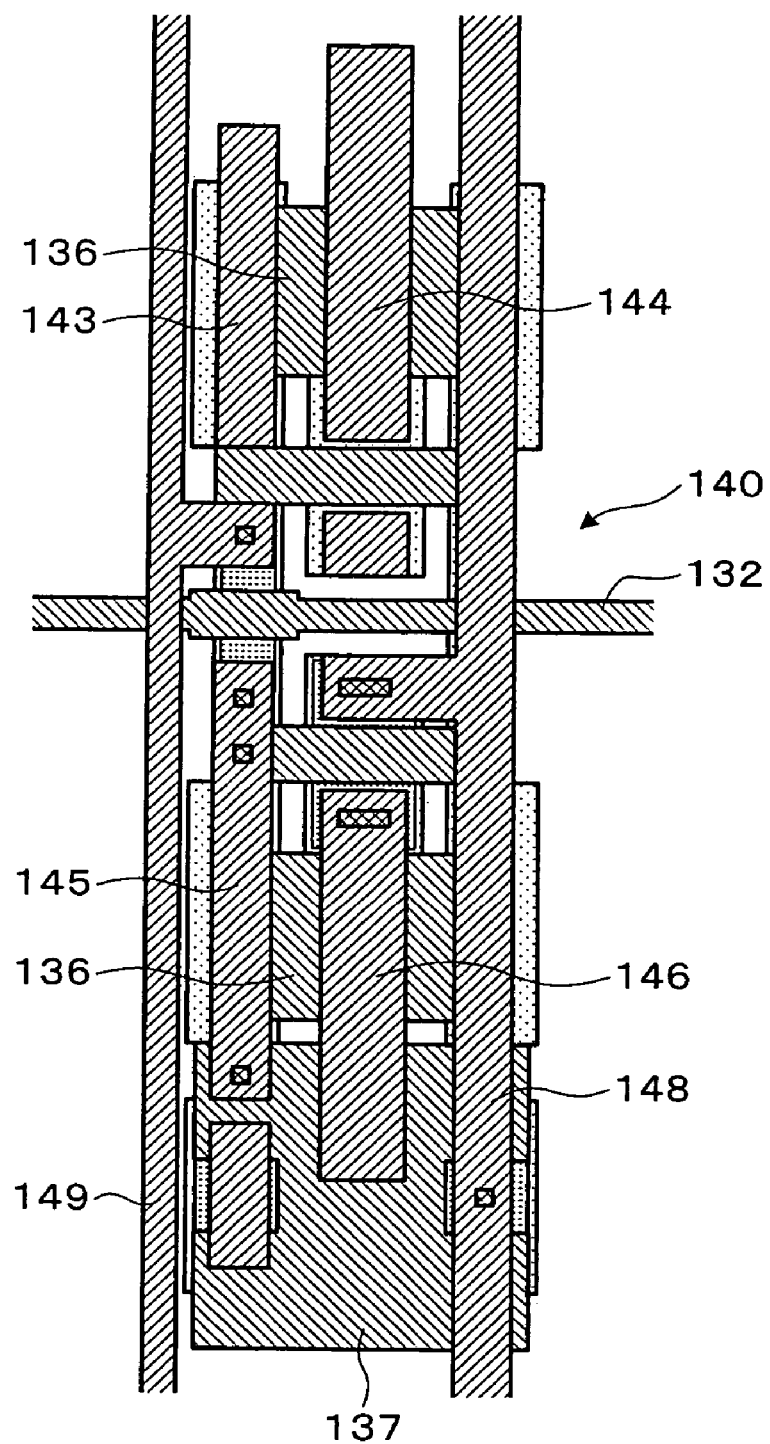
FIG. 10 illustrates an interconnecting pattern positioned in another layer of a plurality of layers forming the interconnect layer.

FIG. 10 illustrates an interconnecting pattern positioned in another layer of a plurality of layers forming the interconnect layer. Over the above described interconnecting pattern 130, an interconnecting pattern 140 may be formed, with an insulating layer interposed.

The interconnecting pattern 140 has, as a part thereof, interconnecting lines 143, 144, 145, 146, and 148. The interconnecting lines 136 of the interconnecting pattern (first interconnecting pattern) 130 and the interconnecting lines 143, 144, 145, 146, and 148 of the interconnecting pattern (second interconnecting pattern) 140 extend mutually parallel. The interconnecting lines 136 and the interconnecting lines 143, 144, 145, 146, and 148 are formed so as not to overlap. According to this embodiment, since the portions of the first and second interconnecting patterns 130 and 140 extending parallel do not overlap, even if there are projections and recesses formed in the electrode 150 (see FIG. 11) formed over them, the vertical differences in these projections and recesses are reduced, and the uniformity of film thickness of the functional layer can be increased. The interconnecting pattern 140 has an interconnecting line 149 disposed on the outside of the electrode 150 (see FIG. 11).

Figure 11:
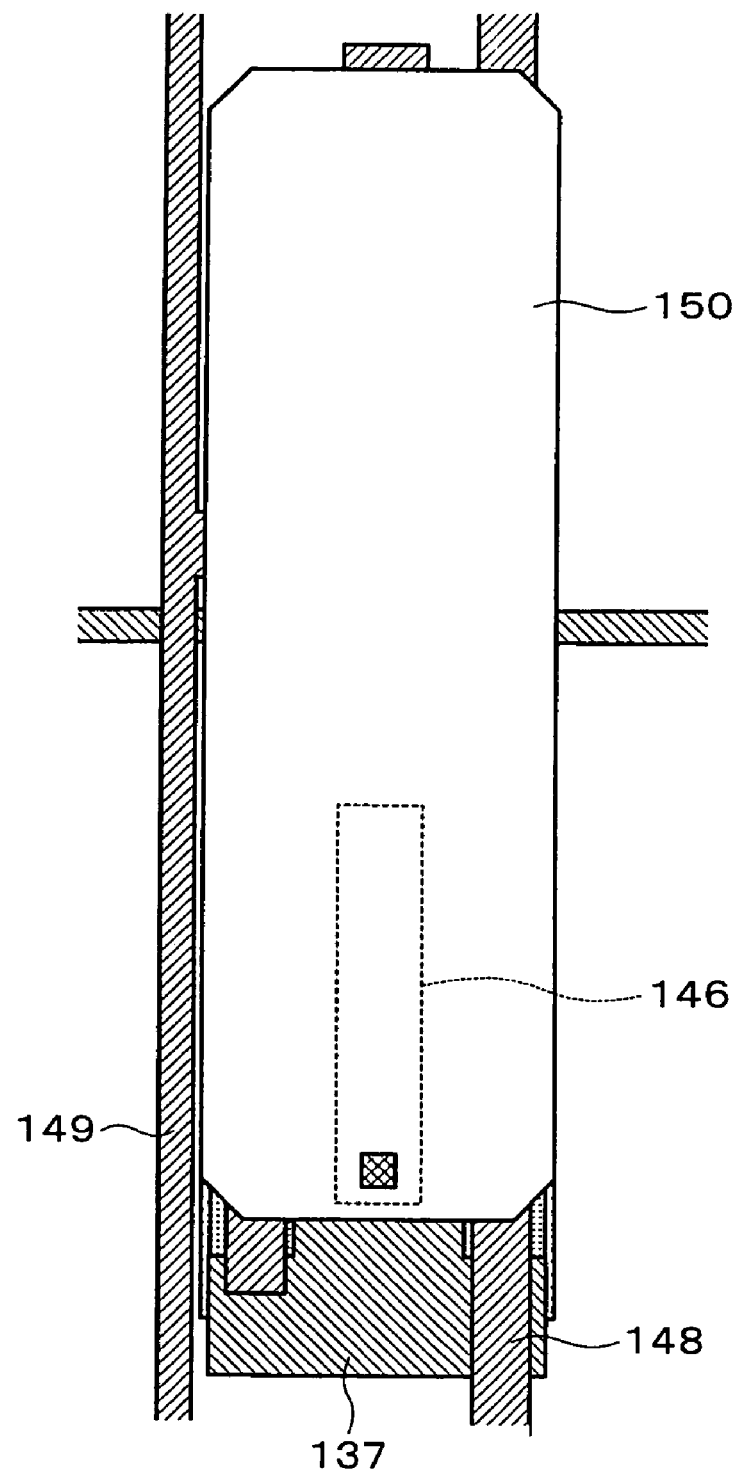
FIG. 11 illustrates an electrode over the interconnect layer.

The electro-optical device has a plurality of electrodes. FIG. 11 illustrates such an electrode. The electrode 150 is formed so as to overlap the above described interconnect layer (For example, this includes the interconnecting patterns 130 and 140.). The electrode 150 may be electrically connected to the interconnecting pattern 140 (for example the interconnecting line 146 thereof) which is the uppermost layer of the interconnect layers. Underneath the electrode 150, the interconnecting lines 131, 132, and 133 extend parallel to each other at the same intervals. Underneath the electrode 150, an interconnecting line (dummy interconnecting line) 136 is formed. Underneath the electrode 150, the interconnecting lines 136 and interconnecting lines 143, 144, 145, 146, and 148 are formed so as not to overlap.

For the method of manufacture of this embodiment of the electro-optical device, the description of the first embodiment can be applied.

Figure 12:
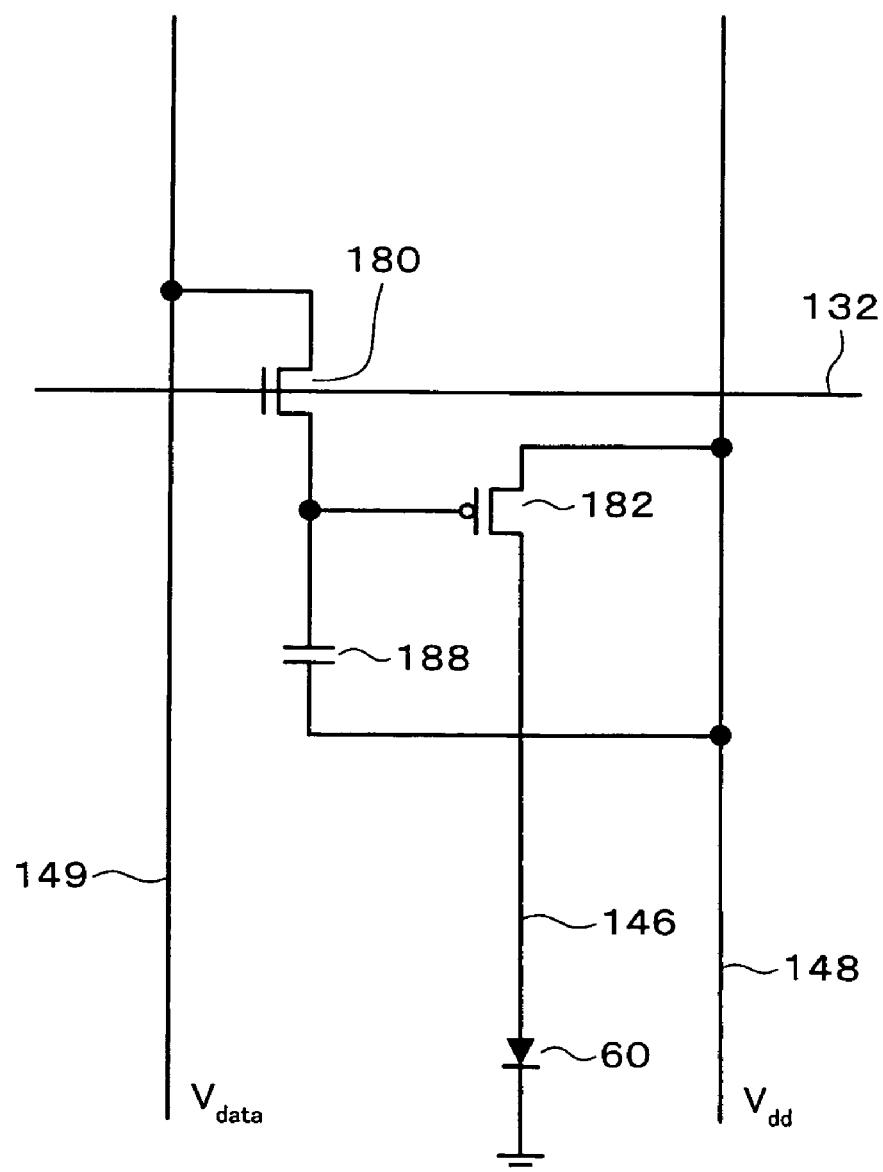
FIG. 12 is a circuit diagram of an electro-optical device in accordance with the second embodiment of the present invention.

FIG. 12 is a circuit diagram illustrating the operation of the electro-optical device of this embodiment. The electro-optical device has elements corresponding to the circuit shown in FIG. 12. The elements are provided for each operating element 60. The circuit construction (connection pattern of the elements) is as shown in FIG. 12, and description thereof is omitted. In this embodiment a power supply voltage $V_{dd}$ is supplied to the interconnecting line 148. A signal voltage $V_{data}$ is supplied to the interconnecting line 149. The signal voltage $V_{data}$ is a signal corresponding to the electric current supplied to the operating element 60. One electrode of the operating element 60 is electrically connected to ground potential. A selection signal is input to the interconnecting line (scan line) 132. The selection signal is a high level signal of a higher potential or a low level signal of a lower potential.

In a programming interval, a high level signal is input to the interconnecting line 132, the switching element 180 turns on, and according to the potential difference between the power supply voltage $V_{dd}$ and the signal voltage $V_{data}$, the capacitor 188 is charged. At this point, if the power supply voltage $V_{dd}$ is higher than ground potential, an electric current flows from the interconnecting line 148 through the switching element 182 and the operating element 60.

In an operating interval (for example a light emitting interval), a low level signal is input to the interconnecting line 132, and the switching element 180 turns off. Then the switching element 182 is controlled (for example, turned on) by a control voltage (a gate voltage when the switching element 182 is a MOS transistor) according to the charge stored in the capacitor 188 in the programming interval, and an electric current depending-on the control voltage flows from the interconnecting line 148 via the switching element 182, and through the operating element 60.

Figure 13:
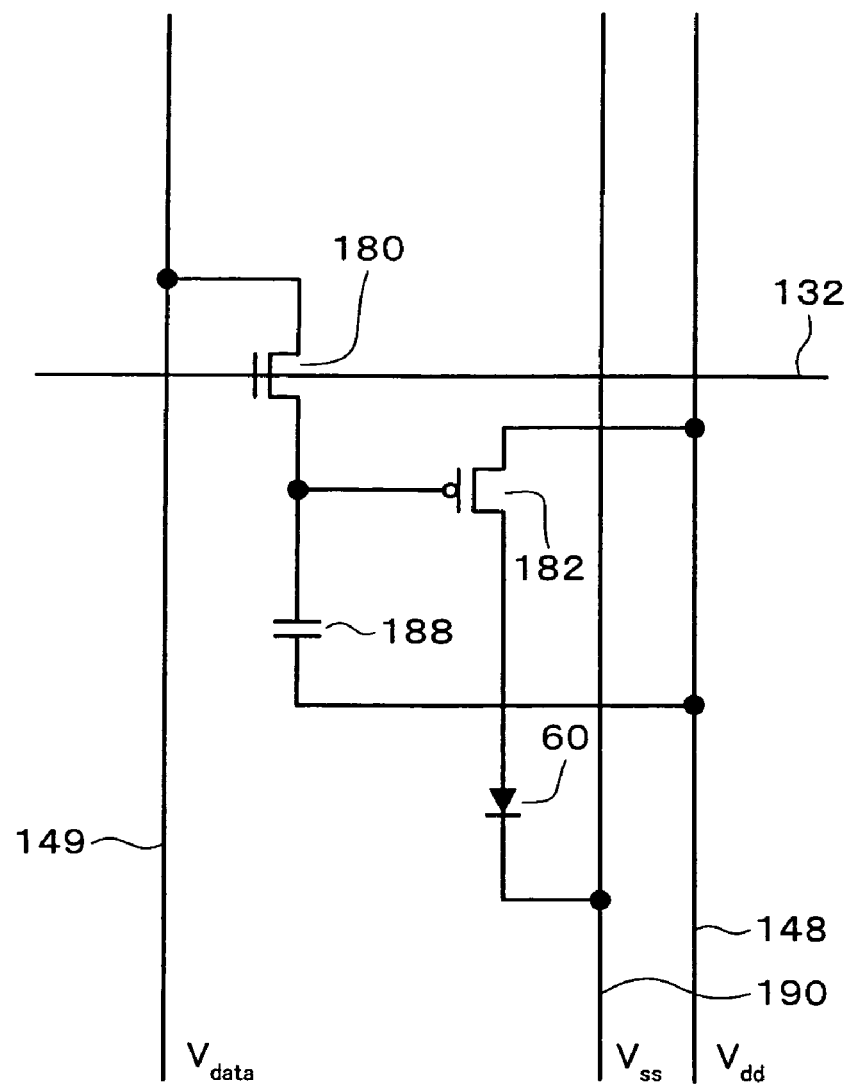
FIG. 13 is a circuit diagram of an electro-optical device in accordance with a modification of the second embodiment of the present invention.

FIG. 13 is a circuit diagram illustrating the operation of an electro-optical device of a modification of this embodiment. In this modification, one electrode of the operating element 60 is electrically connected to an interconnecting line 190, and a reference voltage $V_{SS}$ is supplied to the interconnecting line 190. The reference voltage $V_{SS}$ is switched to either of a voltage the same as the power supply voltage $V_{dd}$ and a voltage (for example ground potential) lower than the power supply voltage $V_{dd}$. In other respects, the circuit construction is the same as the circuit shown in FIG. 12.

In a programming interval, a high level signal is input to the interconnecting line 132, and the reference voltage $V_{SS}$ becomes the same voltage as the power supply voltage $V_{dd}$. Then the switching element 180 turns on, and according to the potential difference between the power supply voltage $V_{dd}$ and the signal voltage $V_{data}$, the capacitor 188 is charged. It should be noted that since the reference voltage $V_{SS}$ is the same voltage as the power supply voltage $V_{dd}$, no electric current flows in the operating element 60.

In an operating interval (for example a light emitting interval), a low level signal is input to the interconnecting line 132, and the switching element 180 turns off. The reference voltage $V_{SS}$ becomes a voltage (for example ground potential) lower than the power supply voltage $V_{dd}$. Then the switching element 182 is controlled (for example, turned on) by a control voltage (a gate voltage when the switching element 182 is a MOS transistor) according to the charge stored in the capacitor 188 in the programming interval, and an electric current depending on the control voltage (an electric current depending on the potential difference between the reference voltage $V_{SS}$ and the power supply voltage $V_{dd}$) flows from the interconnecting line 148 via the switching element 182, and through the operating element 60.

Figure 14:
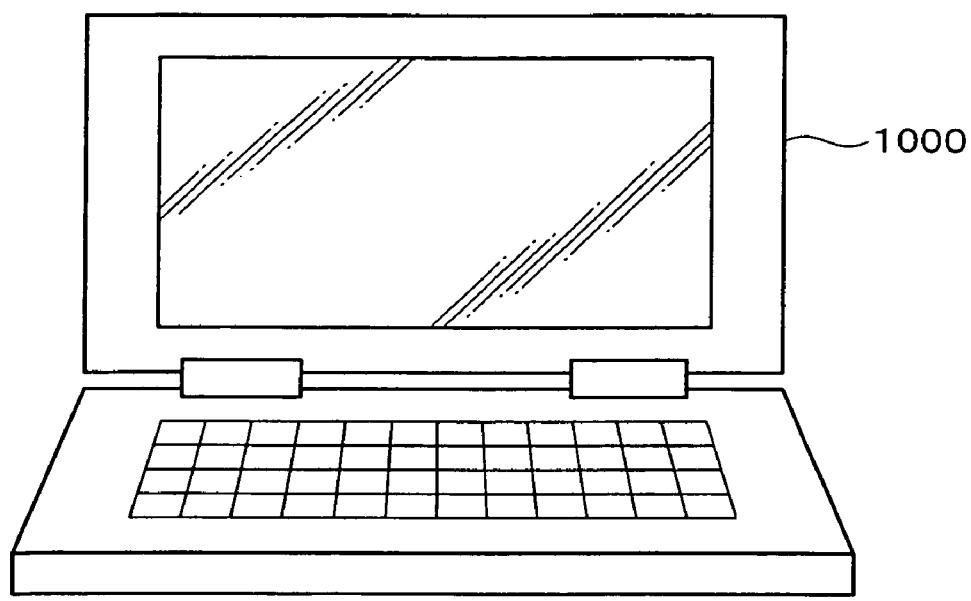
FIG. 14 shows an electronic instrument of an embodiment of the present invention.
Figure 15:
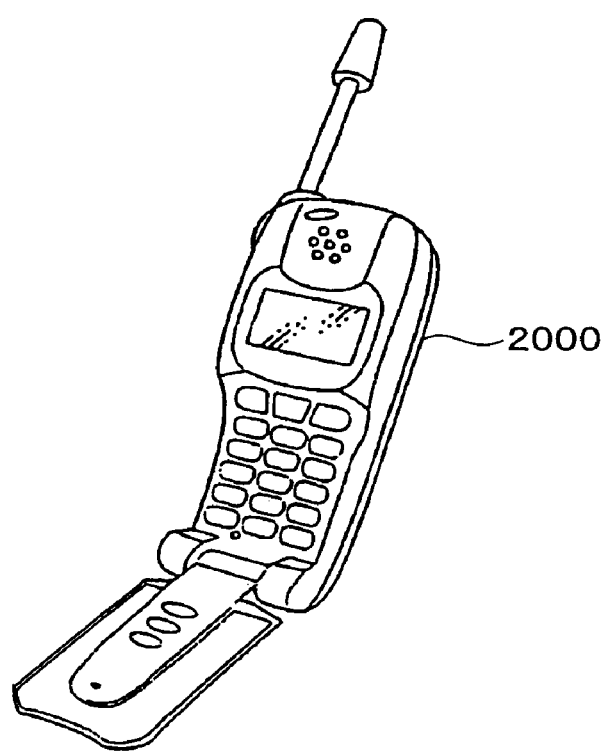
FIG. 15 shows an electronic instrument of an embodiment of the present invention.

As an electronic instrument having the electro-optical device of the embodiment of the present invention, FIG. 14 shows a notebook personal computer 1000, and FIG. 15 shows a mobile telephone 2000.

The present invention is not restricted to the above described embodiments, and various modifications are possible. For example, the present invention includes substantially the same construction as the construction described in the embodiment (for example, a construction for which the function, method, and result are the same, or a construction of which the purpose and result are the same). The present invention includes a construction in which parts which are not of the essence of the construction described in the embodiment are replaced. The present invention includes a construction having the same effect as the construction described in the embodiment or a construction capable of achieving the same purpose. The present invention includes a construction having the construction described in the embodiment to which is added well-known art.

What is claimed is:

1. A wiring board comprising:
   a substrate;
   an interconnect layer formed of a plurality of layers, the interconnect layer being formed over the substrate, the plurality of layers being formed one over another at different levels in a thickness direction of the substrate, one of the plurality of layers having an interconnecting pattern positioned therein, the interconnecting pattern having at least three interconnecting lines disposed parallel to each other; and
   a plurality of electrodes formed to overlap the interconnect layer;
   wherein a part of a first interconnecting pattern and a part of a second interconnecting pattern are disposed to extend in directions forming a lattice under each of the electrodes, the first interconnecting pattern being positioned in a first layer among the plurality of layers forming the interconnect layer, the second interconnecting pattern being positioned in a second layer among the plurality of layers forming the interconnect layer.

2. The wiring board as defined in claim 1, further comprising:
   an organic resin layer formed to cover the interconnect layer, and having an upper surface made flat,
   wherein the electrodes are formed over the organic resin layer and are electrically connected to at least one of plurality of layers forming the interconnect layers by passing through the organic resin layer.

3. An electro-optical device comprising:
   the wiring board as defined in claim 1; and
   a functional layer for constituting an electro-optical element, the functional layer being formed in a first region of each of the electrodes;

wherein each of the electrodes and one of the plurality of layers forming the interconnect layer supplying power to the electrode are connected in a second region of the electrode.

4. An electronic instrument comprising the electro-optical device as defined in claim 3.

5. A wiring board comprising:

a substrate;

an interconnect layer formed of a plurality of layers, the interconnect layer being formed over the substrate, the plurality of layers being formed one over another at different levels in a thickness direction of the one of the plurality of layers having an interconnecting pattern positioned therein, the interconnecting pattern having at least three interconnecting lines disposed parallel to each other; and a plurality of electrodes formed to overlap the interconnect layer;

wherein first and second interconnecting patterns positioned respectively in first and second layers among the plurality of layers forming the interconnect layer have portions extending parallel to each other under each of the electrodes, and the parallel extending portions are formed not to overlap each other.

6. The wiring board as defined in claim 5, further comprising:

an organic resin layer formed to cover the interconnect layer, and having an upper surface made flat, wherein the electrodes are formed over the organic resin layer and are electrically connected to at least one of plurality of layers forming the interconnect layers by passing through the organic resin layer.

7. An electro-optical device comprising:

the wiring board as defined in claim 5; and a functional layer for constituting an electro-optical element, the functional layer being formed in a first region of each of the electrodes;

wherein each of the electrodes and one of the plurality of layers forming the interconnect layer supplying power to the electrode are connected in a second region of the electrode.

8. An electronic instrument comprising the electro-optical device as defined in claim 7.

* * * * *

UNITED STATES PATENT AND TRADEMARK OFFICE
CERTIFICATE OF CORRECTION

PATENT NO. : 7,342,177 B2  Page 1 of 1
APPLICATION NO. : 10/760584
DATED : March 11, 2008
INVENTOR(S) : Koji Aoki It is certified that error appears in the above-identified patent and that said Letters Patent is hereby corrected as shown below:

On the Title Page, (item 73), please replace "Seiko Epson" with --Seiko Epson Corporation--.

Signed and Sealed this

Twenty-second Day of July, 2008

JON W. DUDAS
*Director of the United States Patent and Trademark Office*